United States Patent
Dortu et al.

(10) Patent No.: US 6,922,764 B2
(45) Date of Patent: Jul. 26, 2005

(54) MEMORY, PROCESSOR SYSTEM AND METHOD FOR PERFORMING WRITE OPERATIONS ON A MEMORY REGION

(75) Inventors: Jean-Marc Dortu, München (DE); Robert Feurle, Neubiberg (DE); Paul Schmölz, München (DE); Andreas Täuber, Unterschleissheim (DE)

(73) Assignee: Infineon Technologies AG, Munich (DE)

(*) Notice: Subject to any disclaimer, the term of this patent is extended or adjusted under 35 U.S.C. 154(b) by 418 days.

(21) Appl. No.: 10/299,750

(22) Filed: Nov. 19, 2002

(65) Prior Publication Data

US 2003/0126382 A1 Jul. 3, 2003

(30) Foreign Application Priority Data

Nov. 19, 2001 (DE) .......................................... 101 56 749

(51) Int. Cl.$^7$ .............................................. G06F 12/00
(52) U.S. Cl. ........................ 711/167; 711/100; 711/154; 710/49; 712/5; 714/3
(58) Field of Search ................................. 711/100, 154, 711/167; 710/49; 712/5; 714/3

(56) References Cited

U.S. PATENT DOCUMENTS 4,533,995 A * 8/1985 Christian et al. ........... 711/122
5,572,682 A * 11/1996 Garibay et al. ............. 711/137

FOREIGN PATENT DOCUMENTS

WO    WO 01/43134    6/2001

* cited by examiner

Primary Examiner—Mehdi Namazi
(74) Attorney, Agent, or Firm—Laurence A. Greenberg; Werner H. Stemer; Ralph E. Locher

(57) ABSTRACT

A memory is provided which has a memory region for storing data, an input for receiving a data bundle with a plurality of temporally sequential data blocks and an input for receiving a data mask signal which is assigned to the data bundle. The memory also has a unit for receiving a data block from the plurality of temporally sequential data bundle data blocks which is to be written into the memory region in dependence on the data mask signal. The memory also includes a unit for writing the received data block into the memory region.

12 Claims, 5 Drawing Sheets

MEMORY, PROCESSOR SYSTEM AND METHOD FOR PERFORMING WRITE OPERATIONS ON A MEMORY REGION

FIELD OF THE INVENTION

The present invention relates to the field of data storage systems and, more specifically, to the storage of data in data storage systems.

BACKGROUND OF THE INVENTION AND PRIOR ART

To perform a write operation on a memory such as a RAM (RAM=random access memory=memory with random access), an address, which is assigned to the memory cell in which the data are to be stored, is typically entered in the storage system via an address line. Using the address a column and row line of the storage system is selected and put into an active state, so that the appropriate data can be written into the assigned memory cell.

The ongoing development of data processing devices in respect of processing speeds and the amounts of data made it necessary to design RAMs of ever increasing capacity and higher data throughput.

Activation of the appropriate column and row line always entails a certain expenditure of time, however, making it desirable to transfer as much data as possible each time the storage system is accessed in order to make the most effective use of the data line and to maximize the in-use time of the data line.

A known method of performing a write access on the storage system is to transfer data bundles of successive data blocks, which are stored e.g. in successive memory cells of the same line of the memory. This method increases the data throughput since a bundle of data blocks is transferred for each access operation while e.g. the column address line is activated only once.

Since, however, it is not always desirable or necessary to store a whole bundle of data blocks in one write operation, a data mask signal, which is assigned to a data block, is used to mask data for the write and read instructions.

In the read mode the data mask signal has a latency (delay time) of two clock signal units and is used to put the data output buffer into a HiZ-like state in accordance with an out-put enable signal.

In the write mode the data mask signal has a latency of zero clock signal units in known storage systems and acts as a word mask. The input data of a data block are written into a memory region if the data mask signal is in a logically low state, while a write operation to the memory region is blocked if the data mask signal is in a logically high state.

In addition, in x16 operation, i.e. for a data bus line with 16 bits, in known storage systems a method is used which employs two data mask signals so as to enable bytewise control to be achieved. The first data mask signal acts on the first eight bits of a data block and the second data mask signal acts on the last eight bits of the data block. This makes one-byte-level control possible for a 16 bit data line, so that e.g. just a single byte, i.e. eight bits, of the data block is written into the memory.

To enable a high data throughput to be achieved, it is desirable that the data should be transferred with a higher frequency, e.g. double the frequency of the clock signal.

However, this requires that the data mask signal be generated and transmitted with the frequency of the data blocks since, in known methods, the information of the data mask signal always refers to a single data block. Further, at high data signal transfer frequencies a transfer line which is optimized for high frequencies is needed for the data mask signals. In addition, the generation of the data mask signal with the time demands of an increased frequency adjusted to that of the data signal is complicated and costly. Another point is that existing equipment which is present in a processor system and adjusted to the simple clock signal frequency cannot be used.

SUMMARY OF THE INVENTION

It is the object of the present invention to provide a simpler and cheaper concept for storing data with high data transfer rates.

In accordance with a first aspect the invention, this object is achieved by a memory comprising a memory region for storing data; an input for receiving a data bundle with a plurality of temporally sequential data blocks; an input for receiving in parallel, a first signal and a second signal, the first signal and the second signal forming a data mask signal which is assigned to the data bundle; a unit for receiving from the plurality of temporally sequential data blocks of the data bundle a data block which is to be written into the memory region in dependence on the data mask signal; wherein the unit for receiving is formed to receive a first set of temporally sequential data blocks of data bundle depending on the first signal, which is to be written into the memory region, and a second set of temporally sequential data blocks of the data bundle depending of the second signal which is to be written into the memory region; and a unit for writing the received data block into the memory region.

In accordance with a second aspect of the invention, this object is achieved by a processor system comprising a memory comprising a memory region for storing data; an input for receiving a data bundle with a plurality of temporally sequential data blocks; an input for receiving in parallel, a first signal and a second signal, the first signal and the second signal forming a data mask signal which is assigned to the data bundle; a unit for receiving from the plurality of temporally sequential data blocks of the data bundle a data block which is to be written into the memory region in dependence on the data mask signal; wherein the unit for receiving is formed to receive a first set of temporally sequential data blocks of data bundle depending on the first signal, which is to be written into the memory region, and a second set of temporally sequential data blocks of the data bundle depending of the second signal which is to be written into the memory region; and a unit for writing the received data block into the memory region; and a central processing unit comprising a unit for generating a data bundle with a plurality of temporally sequential data blocks; and a unit for generating the first and the second signal, the first signal and the second signal forming a data mask signal which is assigned to the data bundle.

In accordance with the third aspect of the invention, this object is achieved by a method for performing write operations on a memory region comprising the following steps, receiving a first signal and a second signal in parallel, the signals forming data mask signal; receiving a data bundle with a plurality of temporally sequential data blocks; receiving a data block having a first set of temporally sequential data blocks of the data bundle depending on the first signal, which is to be written into the memory region, and a second set of temporally sequential data blocks of the data bundle depending on the second signal which is to be written into the memory region; and writing the received data block into the memory region.

The present invention is based on the finding that a selection method for selecting data to be written into a memory can be achieved by using a data mask signal containing information which is assigned to a data bundle which comprises a number of data blocks. Depending on the data mask signal which is assigned to a data bundle, a data block is obtained from a plurality of temporally sequential data blocks of the data bundle and the data block thus obtained is written into a memory region.

An advantage of the present invention is that the data mask signal information assigned to the data bundle can be transferred with a lower frequency than the frequency of the data signal, in consequence of which the transfer line does not have to be optimized to the high frequency of the data. In one embodiment the data mask signal is generated as the address and transferred on the address line, providing the opportunity of further cost cutting and reduced circuit complexity.

In a preferred embodiment a first and second data mask signal are used to perform a selection method for obtaining a data block from a plurality of temporally sequential data blocks for storage in a memory region. The first data mask signal, which can assume two logical states, is used to mask a first set of temporally sequential data blocks of a data bundle, while the second data mask signal with two logical states is used to perform masking of a second set of temporally sequential data blocks of the data bundle.

In one embodiment a data bundle comprises two temporally sequential data blocks, the first data mask signal masking the earlier data block, and the second data mask signal masking the later data block. In another embodiment the data bundle comprises four temporally sequential data blocks, the first data mask signal masking the two earlier data blocks of the data bundle, and the second data mask signal masking the last two data blocks of the data bundle.

BRIEF DESCRIPTION OF THE DRAWINGS

Preferred embodiments of the present invention are described in more detail below making reference to the enclosed drawings, in which.

DETAILED DESCRIPTION OF THE PREFERRED EMBODIMENTS

Figure 1:
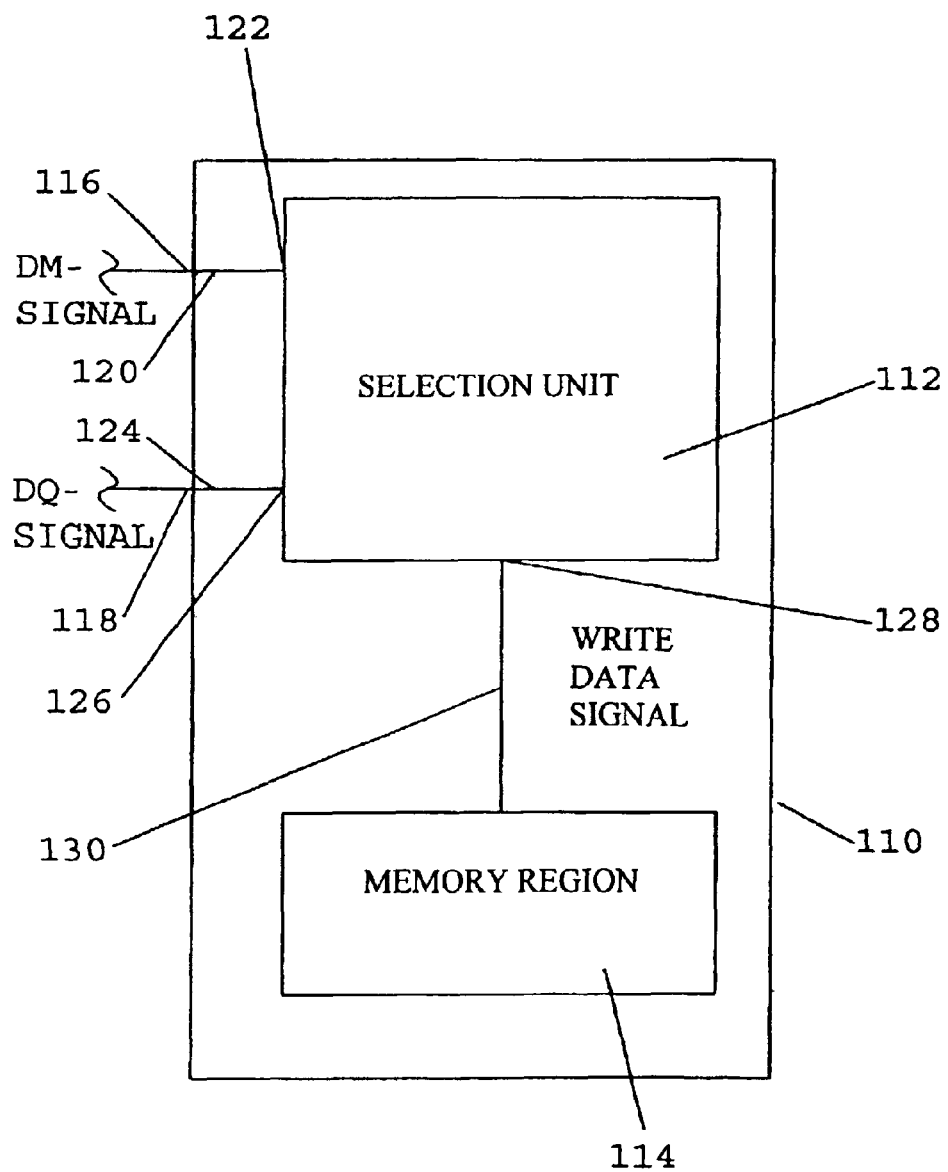
FIG. 1 shows a block diagram of an embodiment of the present invention.

FIG. 1 shows, as an embodiment of the present invention, a memory 110, which might be a RAM or DRAM, and which contains a selection unit 112 and a memory region 114. The memory 110 also has a first input 116 for applying a data mask signal DM and a second input 118 for applying data signals DQ. The first input 116 is connected to a first input 122 of the selection unit 112 via a line 120. Also, the second input 118 is connected to a second input 126 of the selection unit 112 via a line 124. Furthermore, an output 128 of the selection unit 112 is connected to a memory region 114 via a line 130.

In operation, data bundles with a plurality of temporally sequential data blocks are applied to the second input 118, the data block signals preferably having a doubled clock signal frequency. The data blocks might e.g. consist of a word with 8 bits or, in a x16 mode, 16 bits, the line 124 preferably being designed to transfer the individual bits of the data blocks in parallel. A data bundle can e.g. have a length of two temporally sequential data blocks or a length of four temporally sequential data blocks. The data bundles with the plurality of temporally sequential data blocks to be stored, applied via the input 118, are input to the selection unit 112 via the line 124. In addition, a data mask signal DM is input via the input 116 and the line 120, the data mask signal containing information for masking a data bundle. Using the data mask signal DM the selection unit 112 then performs a selection method to select for each data bundle which of the plurality of temporally sequential data blocks of the data bundle of the data signal DQ should be used for storage in the memory region 114.

Figure 2:
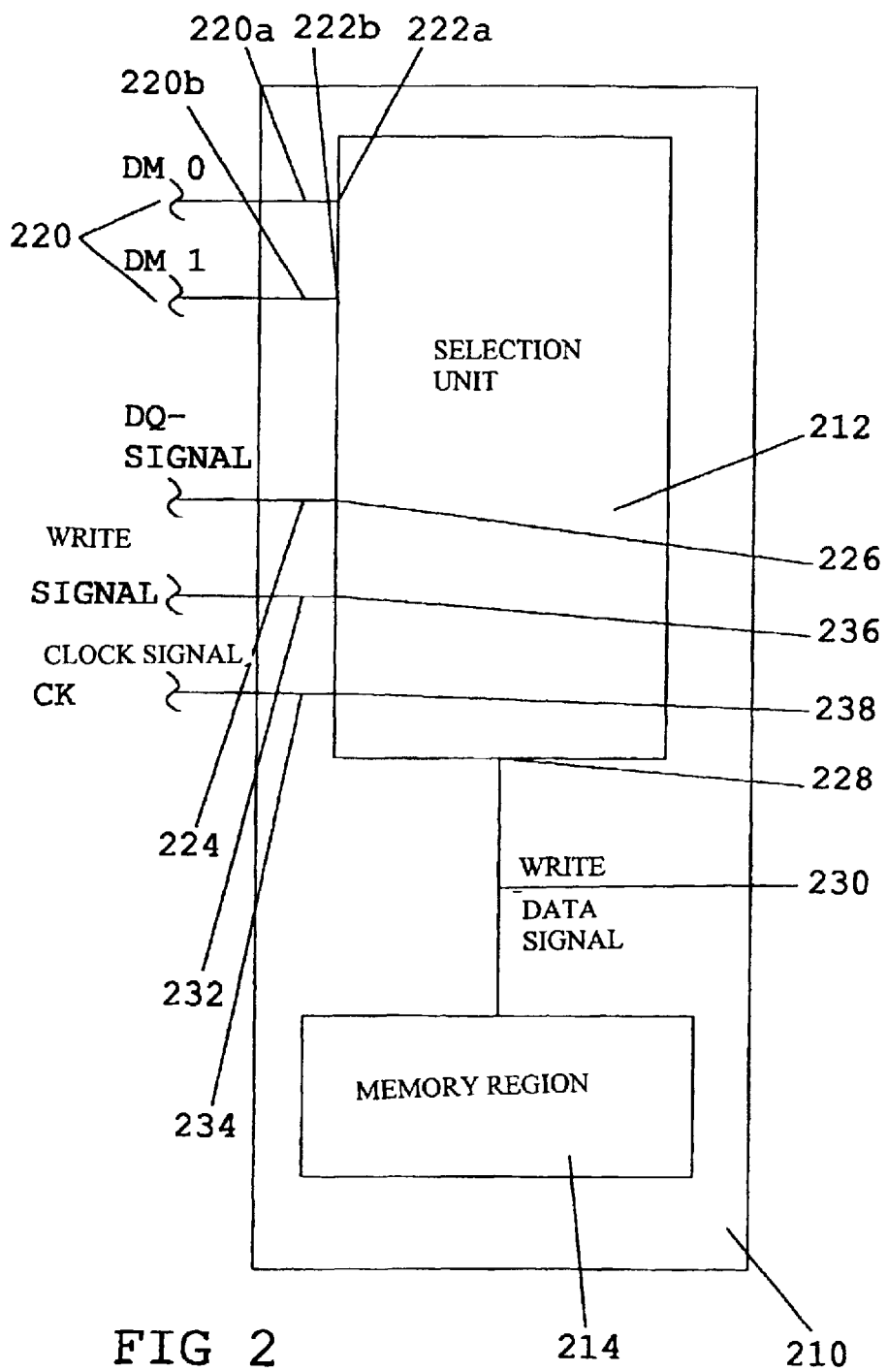
FIG. 2 shows a block diagram of a preferred embodiment of the present invention.

For preference the line 120 can have two or more parallel signal lines, so as e.g. to transfer the data mask information as two data mask signals with two logical states, as is described below making reference to FIG. 2. Furthermore, the data mask signal can be transferred on one signal line and comprise more than two logical states so as to perform the selection method for obtaining the data blocks of a data bundle to the memory.

If the data bundles have only two temporally sequential data blocks, e.g., then the data mask information which is input comprises four logical states in order to encompass the four possibilities named hereafter, the four states resulting e.g. from two signals, each with two logical states. Firstly the information can indicate that both data blocks of a special data bundle are to be stored, the second possibility is that neither of the data blocks of a special data bundle is intended for storage, the third possibility that just the earlier data block of a special data bundle should be stored, and the fourth possibility is that just the later data block of a special data bundle is to be stored.

Equally, the data bundle can comprise more than two data blocks. The data mask information might then e.g. result in a first unit of earlier data blocks and a second unit of later data blocks being controlled as regards being written into the memory region, as will be explained in more detail making reference to FIG. 4.

Moreover, the data mask information can also comprise more than four logical states, in order e.g. to control with sufficient precision a data bundle with a large number of data blocks.

Using the data mask signal the selection unit 112 performs the selection method for a respective data bundle, i.e. the masking of the data blocks of the data bundle, employing known devices. Such known devices comprise e.g. known logic elements, which are connected to delay units so as to effect blocking of a storage operation for a particular data block or to perform a storage operation for a particular data block, all at the appropriate time.

Once the data blocks of a respective data bundle have been obtained for storage through the selection process, the data blocks to be stored are placed on the line 130 via the output 128 of the selection unit and are then stored in the memory region 114 using known devices.

Making reference to FIG. 2 a preferred embodiment of the present invention will now be explained. A memory 210 comprises a selection unit 212 and a memory region 214. The selection unit 212 has two inputs 222a and 222b connected respectively to data mask signal lines 220a and 220b. The selection unit 212 also has an input 226 which supplies data information DQ, which comprises data bundles with a number of temporally sequential data blocks, via a data line 224. Another input 236 of the selection unit 212 is connected to a line 232 to receive a signal SCHREIBEN as command signal, which is generated by e.g. a central processing unit. The selection unit 212 also has an input 238, connected to clock signal line 234, to receive a clock signal CK.

In conformity with the embodiment of FIG. 1 the selection unit 212 has an output 228, which is connected to the memory region 214 via a line 230.

One way of operation of a first preferred embodiment, wherein the selection unit 212 is designed to process data bundles with two data blocks, will now be explained making reference to FIG. 3, and one way of operation of a second preferred embodiment, wherein the selection unit 212 is designed to process data bundles with four data blocks, will then be explained making reference to FIG. 4.

Figure 3:
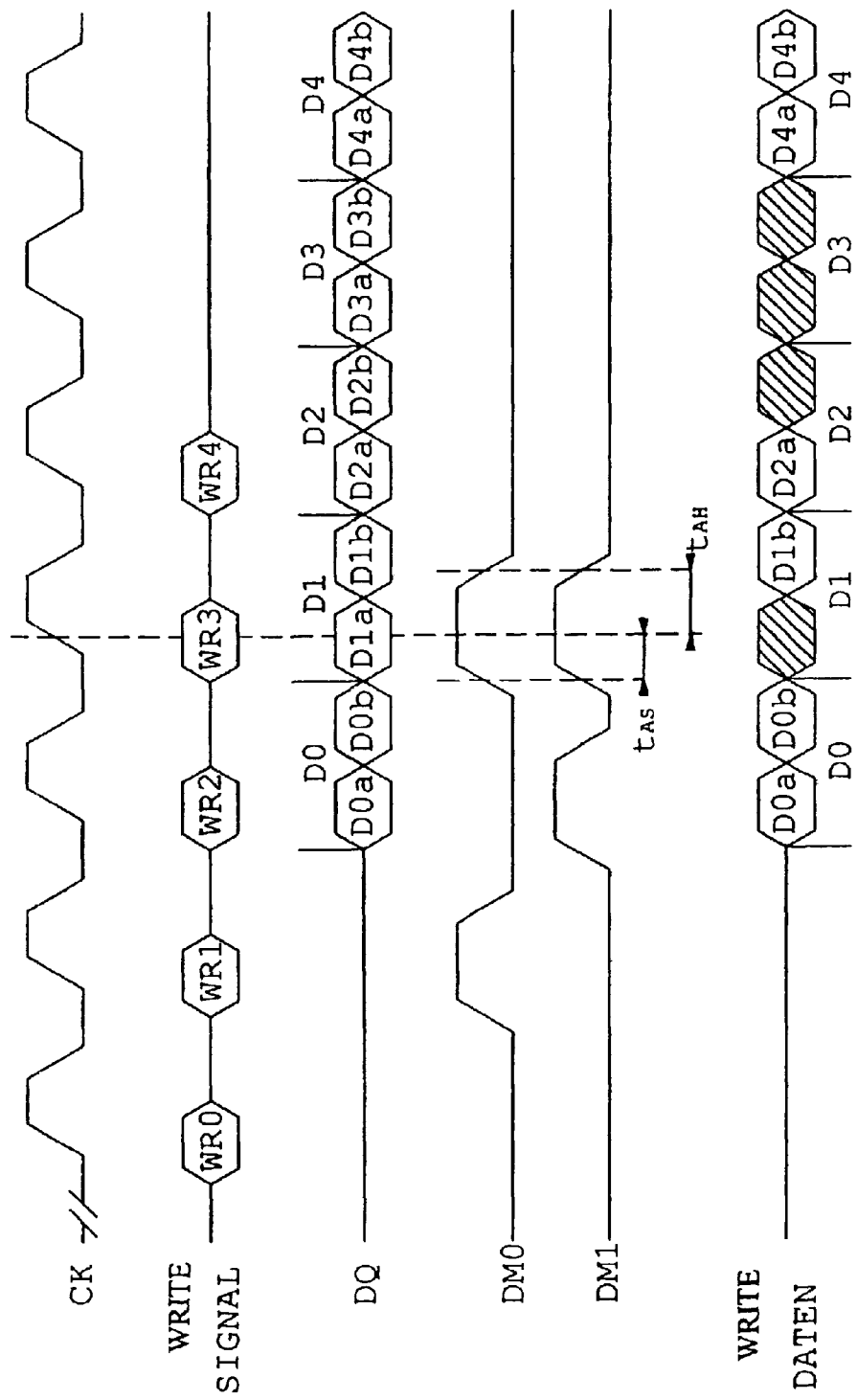
FIG. 3 shows a timing diagram which depicts the behaviour with time of the signals of a first preferred embodiment of the present invention.

FIG. 3 shows a timing diagram, wherein the clock signals CK imposed on the input 238, the WRITE signals imposed on the input 236, the data signals DQ imposed on the input 226, first data mask signals DM0 imposed on the input 222a, second data mask signals DM1 imposed on the input 222b, and write data signals at the output 228 of the selection unit 212 for writing data into the memory region 214, are depicted.

In this embodiment the data mask signals DM0 and DM1 are generated coincidentally with the WRITE signal which is assigned to a respective data bundle, preferably as address signals, and are processed in the selection unit 212 by appropriate known logic devices. As can be seen from the diagram, the data signals DQ are generated with double the clock signal frequency.

In FIG. 3 five WRITE signals WR0, WR1, WR2, WR3 and WR4 are shown, which are generated successively one after the other in unison with the clock signal CK. The timing diagram also shows the data mask signals DM0 and DM1, with two logical states, containing the data mask information.

As can be seen from FIG. 3, the signals DM0 and DM1 are both in a logically low state at the time of appearance of the command signal WR0, which is assigned to a first data bundle D0. At the time of appearance of the command signal WR1, which is assigned to a second data bundle D1, the data mask signal DM0 which is assigned to the data bundle D1 is in a logically high state and the data mask signal DM1 which is assigned to the data bundle D1 is in a logically low state. At the time of appearance of the command signal WR2, which is assigned to the data bundle D2, the data mask signal DM0 is in a logically low state while the data mask signal DM1 is in a logically high state, as can be seen in the diagram. At the time of appearance of the command signal WR3, which is assigned to the data bundle D3, the data mask signal DM0 is in a logically high state and the data mask signal DM1 is in a logically high state. When the command signal WR4 which is assigned to the data block D4, appears, the data mask signal DM0 and the data mask signal DM1 are both in a logically low state.

In this embodiment the states of the data mask signals DM0 and DM1, i.e. the data mask information, which are assigned to a particular data bundle are entered as addresses and are sampled or processed further in the selection unit 212 coincidentally with the WRITE command signal. This means e.g. that for the first data bundle D0 the data mask signal DM0 and the data mask signal DM1 are both in a logically low state, so that the data mask information can be regarded as a state with two logical bits 0.

The selection unit 212 is designed to use the data mask information to perform the selection process for obtaining the data blocks for writing into the memory region 214. In the embodiment which has been described this is achieved by using the data mask signal DM0 to prevent the earlier data block, marked with an a in the figure, of a data bundle from being written to the memory region 214 when the signal DM0 is at a logically high level and to perform a write operation for this block when the data mask signal DM0 is at a logically low level. Similarly the data mask signal DM1 is used to prevent the later data block, marked with a b in the figure, from being written when the data mask signal DM1 is at a logically high level and to perform a write operation for this block when the data mask signal DM1 is at a logically low level.

In the embodiment shown in FIG. 3 the data bundles have a latency of two clock cycles with respect to the appearance of the WRITE signal WR or, since the data mask signal for a particular data bundle is generated simultaneously with the WRITE signal, a latency of two clock cycles with respect to the data mask signals DM0 and DM1.

The selection method is accomplished by feeding the data mask signals into suitable known time displacement devices which, in conformity with the necessary displacement time, are designed so as to exclude the respective data block from the write process or not. This means that to exclude the earlier data block of a data bundle a shorter latency is necessary than in the case of the later data block, which is achieved through the data signals DM1.

In accordance with the above exposition this means that for the data bundle D0 both data blocks D0a and D0b of the data signal are selected for writing into the memory region 214 since the associated data mask signals DM0 and DM1, which appear simultaneously with the associated WRITE command signal WR0, are set to a logically low level. The selected data blocks are also imposed as write data signal on the output 228 for writing into the memory region 214.

For the second data bundle D1 this means that the earlier data block D1a of the data bundle D1 is excluded from storage, as is indicated by the dark area on the write data signal in FIG. 3. In accordance with the fact that the data mask signal DM1 which is assigned to the third data bundle D2 is at a logically high level, the later data block D2b of the data bundle D2 is also prevented from being stored. In accordance with the fact that the data mask signals DM0 and DM1 which are assigned to the fourth data bundle D3 are at a logically high level, the data blocks D3a and D3b are selected to be excluded from storage.

As can be seen in FIG. 3, in this embodiment the data mask signals DM0 and DM1 can have a pulse width greater than a pulse width of the data signals, which have double the frequency of the clock signal CK. The use of data mask signals with such large pulse widths is not possible for known devices since the data mask signal is always assigned to a data block and not to a data bundle, which would result in overlapping of the data mask signal with succeeding data blocks.

Furthermore this has the advantage that the data mask signals can be generated and transmitted simultaneously with the WRITE command signal with known devices, such as address devices used to generate and transmit address information. This represents a simplification as regards the provision of devices for generating and transmitting the data mask signals, e.g. of devices used to generate and transmit address signals.

As shown in FIG. 3, the data mask signal has a setup time $t_{AS}$, which extends roughly from the instant the edge has risen to half the value of the high level to about the middle of the pulse. The signal profile of the data mask signals also exhibits a hold time $t_{AH}$, which extends from about the middle of the pulse to the instant when the falling edge reaches about half the high level. Since in this embodiment the data mask signals DM0 and DM1 are input as addresses, the setup time $t_{AS}$ and the hold time $t_{AH}$ correspond to the address setup time and the address hold time.

Making reference to FIG. 4 a second preferred embodiment, wherein the data bundle comprises four temporally sequential data blocks, will now be explained. Also, the embodiment according cording to FIG. 4, in contrast to the embodiment according to FIG. 3, exhibits a latency of one clock cycle.

Figure 4:
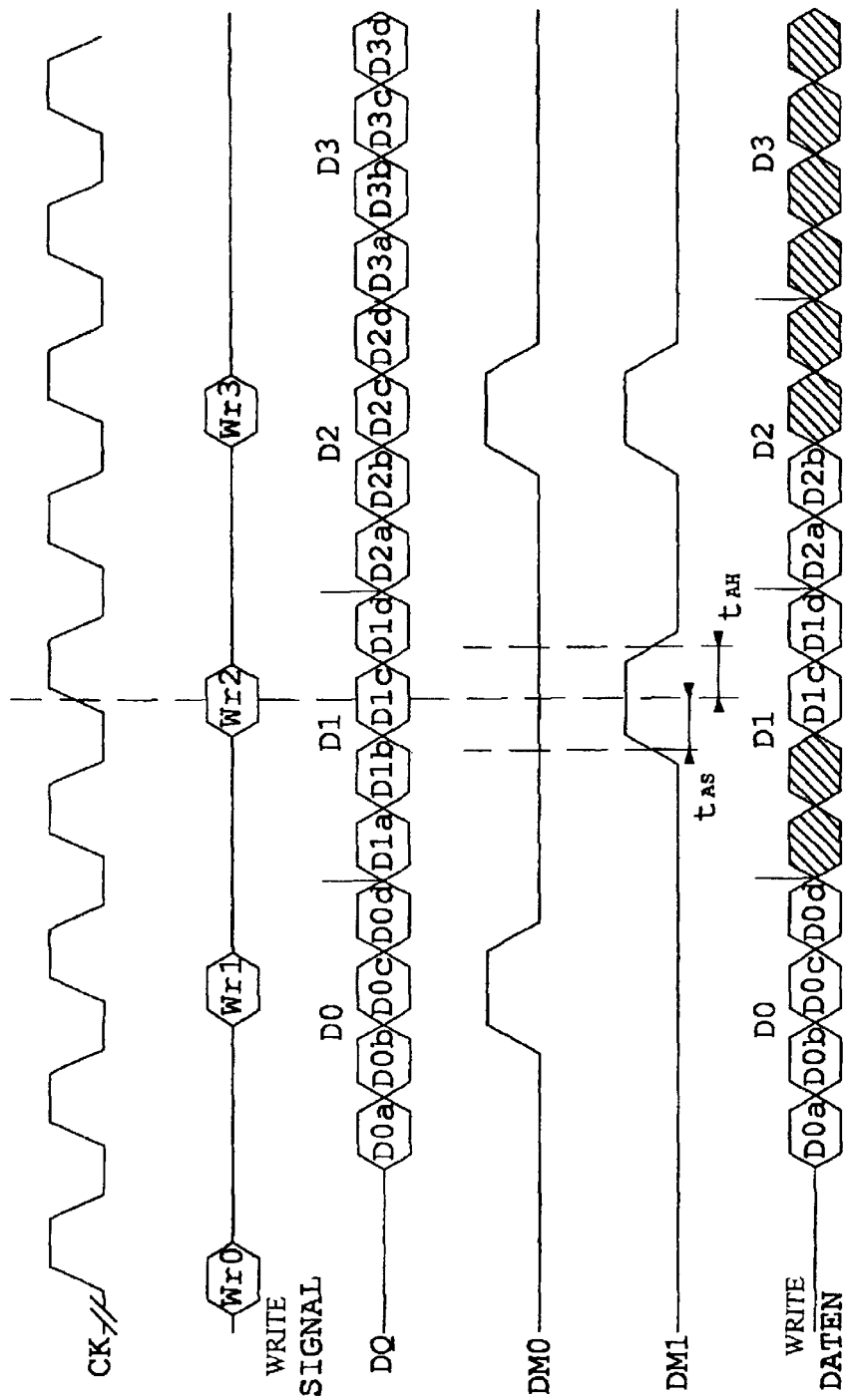
FIG. 4 shows a timing diagram which depicts the behaviour with time of the signals of a second preferred embodiment of the present invention.

FIG. 4 shows a timing diagram in which the clock signals CK, the WRITE command signals, the data signals DQ, the data mask signals DM0 and DM1 and the write data signals are shown as a function of time. In the timing diagram of the WRITE command signal four write command signals Wr0, Wr1, Wr2 and Wr3 are shown. In contrast to FIG. 3, wherein an embodiment for processing a data bundle with two data blocks was shown, in this embodiment the WRITE command signals are generated with a temporal interval of two clock cycles of the clock signal CK since in this embodiment the data bundle has a length of four data blocks, two data blocks at a time being combined into a unit for controlling storage.

As in the embodiment according to FIG. 3, in this embodiment also the data mask signals DM0 and DM1 are input as addresses, which means that the data mask signals occur in synchronism with the WRITE command signals and thus likewise exhibit a temporal interval of two clock cycles.

As is shown in FIG. 4, the data mask signals DM0 and DM1, i.e. the data mask information, assigned to the data bundle D0, are both in a logically low state at the moment of appearance of the WRITE command signal Wr0. This means that the data blocks D0a-D0d of the data bundle D0, which is presented to the data line with a time delay of one clock cycle, are not excluded from being written into the memory region 214. The data mask information for the data bundle D0 has, according to the state of the data mask signals, a logically high state for the data mask signal DM0 and a logically low state for the data mask signal DM1.

In this embodiment the selection unit is so designed that the first two data blocks of a data bundle, e.g. for the data bundle D1 the data blocks D1a and D1b, form a unit as regards the decision whether storage is to be effected or not, both being excluded from storage if the data mask signal DM0 assigned to the data bundle is in a logically high state. If the data mask signal DM0 is in a logically low state, the two first data blocks of the data bundle are chosen for storage.

Similarly the last two data blocks of a data bundle constitute a unit as regards the storage decision process. If the data mask signal DM1 is in a logically high state, the last two data blocks of a data bundle are excluded from storage, if the data mask signal DM1 is in a logically low state, the last two blocks of the data bundle are chosen for storage.

Since the data mask signal DM0 for the second data bundle D1 is in a logically high state, the selection unit 212 chooses the first two data blocks D1a and D1b of the data bundle D1 so as to exclude them from the storage process, as is indicated by the dark areas. This means that the data blocks D1a and D1b are not presented at the output 228 to be written into the memory region 214, as the dark areas in the write data signals indicate.

In addition, the data mask information for the third data bundle D2 exhibits a logically low state for the data mask signal DM0 and a logically high state for the data mask signal DM1. This means that the selection unit 212 selects the last two data blocks of the data bundle D2, i.e. D2c and D2d, to exclude them from the storage process.

The data mask information for the data bundle D3 exhibits a logically high state for the data mask signal DM0 and a logically high state for the data mask signal DM1. Consequently, the selection unit 212, in response to the logically high states of the data mask signals for the data bundle D3, will exclude all the data blocks D3a, D3b, D3c and D3d from being written into the memory region 214, i.e. no data block of this data bundle is written into the memory region 214.

As is clear from the above, the selection unit 212 in the embodiment according to FIG. 4 is designed to make use of the data mask signals DM0 and DM1 to choose whether for the respective data bundle, which appears with a temporal delay of one clock cycle, the two earlier data blocks of the data bundle should be excluded from the write process or not and also whether the two later data blocks of the data bundle should be excluded from the write process or not. As has already been mentioned, the selection unit 212 for performing the selection process might e.g. employ known delay loops into which the data mask signals are fed so as to exclude selected data blocks from storage at the moment the respective assigned data blocks appear or to place data blocks on the line 230, known logic circuits being utilized for these actions.

As in the embodiment according to FIG. 3, in this embodiment too the data mask signals DM0 and DM1 are sampled as addresses, i.e. simultaneously with the WRITE command signal. Also the setup time $t_{AS}$ and the hold time $t_{AH}$, shown in FIG. 4 for the data mask signal DM1 which is assigned to the third data bundle D2, exhibit the address setup time and address hold time, respectively. In a particularly preferred embodiment the data mask signal DM0 and the data mask signal DM1 can here be used as an additional bit of an addressing signal, so that an address bus line can be used to transmit the data mask signal, which constitutes a circuit design simplification.

Although processing of data bundles with a length of two or four data blocks is shown in the embodiments according to FIG. 3 and FIG. 4, further embodiments of the present invention can entail processing of data bundles with three or more than four data blocks.

Likewise, more than two data information bits, i.e. more than two data signals DM0 and DM1 can be provided, to achieve an appropriate granularity as regards selection. For example, in the embodiment according to FIG. 4, data mask information with four bits, i.e. four data mask signals, could be used in order to perform a decision method for each of the data blocks of a data bundle.

Furthermore, latencies of more than two clock cycles can be utilized in further preferred embodiments, the setting being effected to a latency and a granularity or by setting a delay unit of the selection unit 212.

In one embodiment the latency and the granularity, i.e. the number of data blocks which are controlled together in a unit as regards storage, can be kept flexible, so that by applying a control signal the selection unit 212 can be controlled to process a data bundle with a certain number of data blocks and a particular latency.

Figure 5:
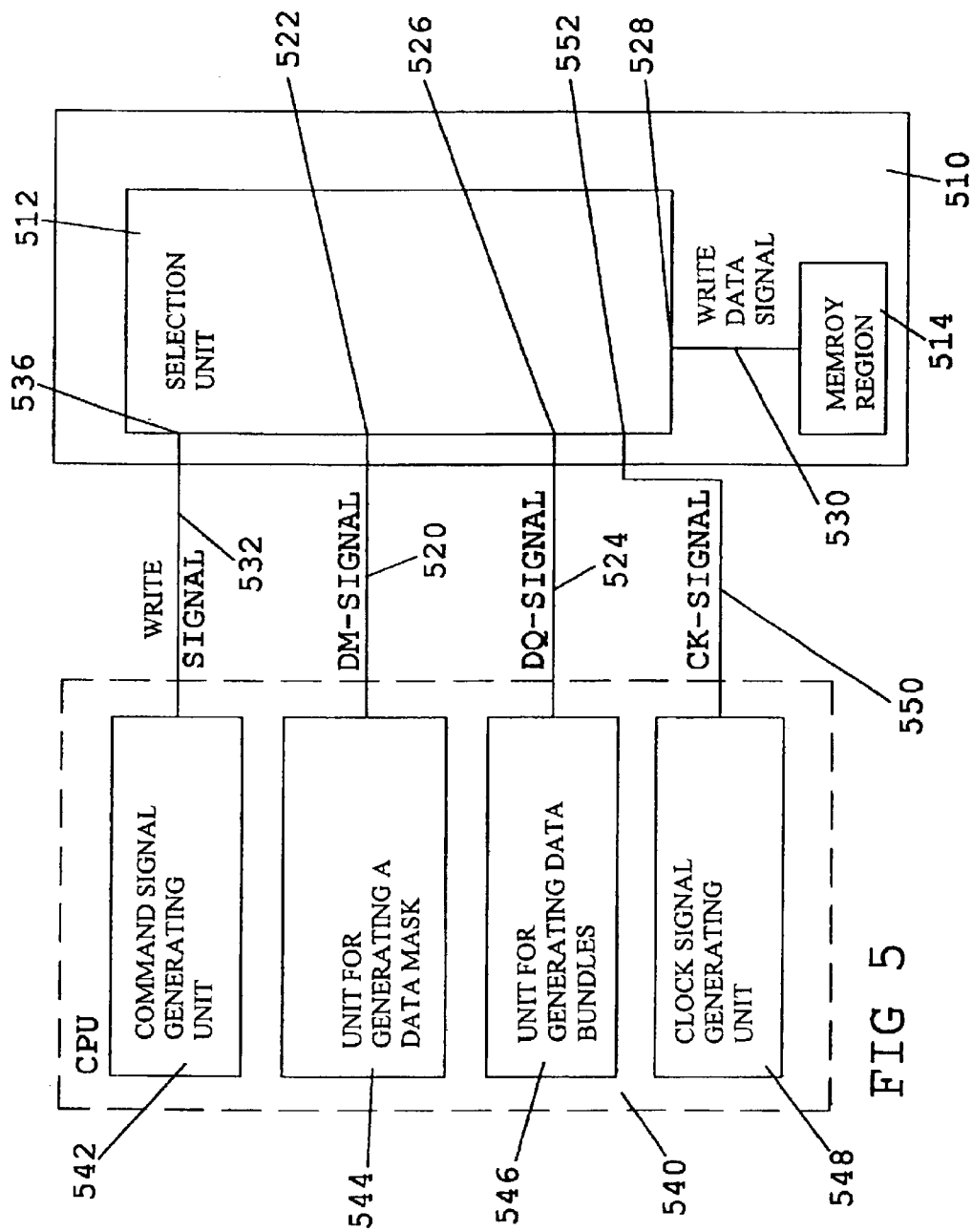
FIG. 5 shows a block diagram of an embodiment of a processor system.

Making reference to FIG. 5, a processor system embodying the concept according to the present invention will now be explained.

A central processing unit 540 includes a command signal generating unit 542, a unit 544 for generating a data mask signal and a unit 546 for generating data bundles. The central processing unit 540 also contains a unit 548 for generating a clock signal CK and which is connected to an input 552 of the selection unit 512 via a line 550. The command signal generating unit 542 is connected to an input 536 of a selection unit 512 of a memory 510 via a line 532. The memory 510 also includes a memory region 514, which is connected to an output 528 of the selection unit 512 via a line 530. The unit 544 for generating a data mask signal is connected to an input 522 of the selection unit 512 via a line 520, and the unit 546 for generating data bundles is connected to an input 526 of the selection unit 512 via a line 524.

In operation the command signal generating unit 542 of the central processing unit 540 generates a WRITE signal, which is applied to the input 536 of the selection unit 512, and the unit 544 for generating a data mask signal generates a data mask signal, such as that shown e.g. in FIG. 3 and FIG. 4. In a particularly preferred embodiment the unit 544 for generating a data mask signal is a unit for generating address command signals, the line 520 then being an address bus line. Consequently, in this preferred embodiment the data mask signal is fed to the input 522 of the selection unit 512 as an address. The unit 546 for generating data bundles generates data bundles with temporally sequential data blocks, where a data bundle might e.g. have two data blocks according to FIG. 3 or four data blocks according to FIG. 4.

The unit 544 for generating a data mask signal and the command signal generating unit 542 are preferably so designed that the data mask signal is generated coincidentally with the WRITE command signal. In accordance with the embodiments according to FIG. 3 and FIG. 4 the data mask signal might comprise two data mask signals DM0, DM1 or more than two data mask signals.

The unit 546 for generating data bundles is preferably designed to generate the data bundles with a predetermined time displacement (latency) as regards the WRITE command signal and the data mask signals, where the latency might e.g. consist of one or two clock cycles of the clock signal CK.

In accordance with the embodiments described previously, the selection unit 512, under the control of the data mask signal DM and the data signal DQ, which comprises the data bundles generated by the unit 546, performs the selection process to select those data blocks which are to be written into the memory region 514. Once the data blocks received for writing have been determined, they are placed on the line 530 via the out-put 528 and are then transferred to the memory region 514, where they are stored in the associated memory cells.

We claim:

1. Memory comprising
   a memory region for storing data;
   an input for receiving a data bundle with a plurality of temporally sequential data blocks;
   an input for receiving in parallel, a first signal and a second signal, the first signal and the second signal forming a data mask signal which is assigned to the data bundle;
   a unit for receiving from the plurality of temporally sequential data blocks of the data bundle a data block which is to be written into the memory region in dependence on the data mask signal; wherein the unit for receiving is formed to receive a first set of temporally sequential data blocks of data bundle depending on the first signal, which is to be written into the memory region, and a second set of temporally sequential data blocks of the data bundle depending of the second signal which is to be written into the memory region; and
   a unit for writing the received data block into the memory region.

2. Memory according to claim 1, wherein the data bundle has two or four data blocks.

3. Memory according to claim 1, wherein the data bundle has two temporally sequential data blocks and the first set of temporally sequential data blocks is the earlier data block of the data bundle and the second set of temporally sequential data blocks is the later data block of the data bundle.

4. Memory according to claim 1, wherein the data bundle has four temporally sequential data blocks and the first set of temporally sequential data blocks are the two earlier data blocks of the data bundle and the second set of temporally sequential data blocks are the third and fourth data blocks of the data bundle.

5. Memory according to claim 1, wherein the data mask signal constitutes an address signal.

6. Memory according to claim 1, wherein the data bundle is received with a time delay compared with the data mask signal, and wherein the unit for receiving a data block has a delay circuit to enable a data block from the plurality of temporally sequential data bundle data blocks which is to be written into the memory region to be received in dependence on the data mask signal.

7. Memory according to claim 1, wherein the memory region is a RAM or DRAM memory region.

8. Processor system comprising
   a memory region for storing data; an input for receiving a data bundle with a plurality of temporally sequential data blocks; an input for receiving in parallel, a first signal and a second signal, the first signal and the second signal forming a data mask signal which is assigned to the data bundle; a unit for receiving from the plurality of temporally sequential data blocks of the data bundle a data block which is to be written into the memory region in dependence on the data mask signal; wherein the unit for receiving is formed to receive a first set of temporally sequential data blocks of data bundle depending on the first signal, which is to be written into the memory region, and a second set of temporally sequential data blocks of the data bundle depending of the second signal which is to be written into the memory region; and a unit for writing the received data block into the memory region; and
   a central processing unit comprising
   a unit for generating a data bundle with a plurality of temporally sequential data blocks; and
   a unit for generating the first and the second signal, the first signal and the second signal forming a data mask signal which is assigned to the data bundle.

9. Processor system according to claim 8, wherein the unit for generating a data mask signal is a unit for generating an address signal.

10. Processor system according to claim 8, wherein the central processing unit also has a command signal generating unit designed to generate a WRITE command signal, and wherein the unit for generating a data mask signal is designed to generate the data mask signal coincidentally with the WRITE command signal.

11. Processor system according to claim 8, wherein the central processing unit also has a unit for generating a clock signal, and wherein the unit for generating data bundles is designed to generate the data bundle with a time delay of N clock signal cycles compared with the data mask signal.

12. Method for performing write operations on a memory region comprising the following steps:

receiving a first signal and a second signal in parallel, the signals forming data mask signal;

receiving a data bundle with a plurality of temporally sequential data blocks;

receiving a data block having a first set of temporally sequential data blocks of the data bundle depending on the first signal, which is to be written into the memory region, and a second set of temporally sequential data blocks of the data bundle depending on the second signal which is to be written into the memory region; and writing the received data block into the memory region.

* * * * *